(12) United States Patent
Hsieh et al.

(10) Patent No.: US 12,221,337 B2
(45) Date of Patent: *Feb. 11, 2025

(54) SEMICONDUCTOR MEMS STRUCTURE

(71) Applicant: Taiwan Semiconductor Manufacturing Company Ltd., Hsinchu (TW)

(72) Inventors: Yuan-Chih Hsieh, Hsinchu (TW); Hsing-Lien Lin, Hsinchu (TW); Jung-Huei Peng, Hsinchu (TW); Yi-Chien Wu, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/358,620

(22) Filed: Jul. 25, 2023

(65) Prior Publication Data
US 2023/0365395 A1   Nov. 16, 2023

Related U.S. Application Data

(60) Continuation of application No. 16/948,641, filed on Sep. 25, 2020, now Pat. No. 11,767,216, which is a
(Continued)

(51) Int. Cl.
*H01L 29/94* (2006.01)
*B81B 3/00* (2006.01)
*H01L 29/82* (2006.01)

(52) U.S. Cl.
CPC .... *B81B 3/0005* (2013.01); *B81B 2201/0235* (2013.01); *B81B 2201/0242* (2013.01); *B81B 2203/04* (2013.01)

(58) Field of Classification Search
CPC .......... B81B 3/0005; B81B 2201/0235; B81B 2201/0242; B81B 2203/04; B81B 7/02; B81C 3/001
(Continued)

(56) References Cited

U.S. PATENT DOCUMENTS 7,692,839 B2   4/2010   Palmateer
7,781,850 B2   8/2010   Miles
(Continued)

FOREIGN PATENT DOCUMENTS

TW   200626475 A   8/2006
TW   200626486 A   8/2006
TW   201107230 A   3/2011

OTHER PUBLICATIONS 201710296032.4 Chinese Office Action and Search Report dated Sep. 26, 2019.

*Primary Examiner* — Theresa T Doan
(74) *Attorney, Agent, or Firm* — Haynes and Boone, LLP

(57) ABSTRACT

The present disclosure provides a structure and method of fabricating the structure. The structure comprises a cavity enclosed by a first substrate and a second substrate opposite to the first substrate. Further, the structure includes a feature in the cavity and the feature is protruded from a surface of the first substrate. In addition, the structure includes a dielectric layer over the feature, wherein the dielectric layer includes a first surface in contact with the feature and a second surface opposite to the first surface is positioned toward the cavity.

20 Claims, 9 Drawing Sheets

Related U.S. Application Data continuation of application No. 16/397,418, filed on Apr. 29, 2019, now Pat. No. 10,787,360, which is a continuation of application No. 15/819,346, filed on Nov. 21, 2017, now Pat. No. 10,273,142, which is a division of application No. 15/142,806, filed on Apr. 29, 2016, now Pat. No. 9,828,234.

(58) Field of Classification Search
USPC ........................................................ 257/419
See application file for complete search history.

(56) References Cited

U.S. PATENT DOCUMENTS

| | | |
|---|---|---|
| 8,905,293 B2 | 12/2014 | Liu |
| 8,977,059 B2 | 3/2015 | Bellegarda |
| 9,040,334 B2 | 5/2015 | Chu |
| 9,065,358 B2 | 6/2015 | Tsai |
| 9,085,455 B2 | 7/2015 | Cheng |
| 9,085,456 B2 | 7/2015 | Tsai |
| 9,122,827 B2 | 9/2015 | Chen |
| 9,133,017 B2 | 9/2015 | Liang |
| 9,138,994 B2 | 9/2015 | Peng |
| 9,139,420 B2 | 9/2015 | Chang |
| 9,139,423 B2 | 9/2015 | Chien |
| 9,181,083 B2 | 11/2015 | Tsai |
| 9,187,317 B2 | 11/2015 | Cheng |
| 9,233,839 B2 | 1/2016 | Liu |
| 9,236,877 B2 | 1/2016 | Peng |
| 9,238,581 B2 | 1/2016 | Wu |
| 9,828,234 B2 | 11/2017 | Hsieh |
| 10,273,142 B2 | 4/2019 | Hsieh |
| 11,767,216 B2 * | 9/2023 | Hsieh ............... B81B 3/0005 257/419 |
| 2003/0166342 A1 | 9/2003 | Chinn |
| 2006/0214246 A1 | 9/2006 | Garcia |
| 2007/0017287 A1 | 1/2007 | Kubena |
| 2011/0049652 A1 | 3/2011 | Wu |
| 2014/0287548 A1 | 9/2014 | Lin |
| 2015/0035089 A1 | 2/2015 | Liu |
| 2015/0137303 A1 | 5/2015 | Chou |
| 2015/0175405 A1 | 6/2015 | Cheng |
| 2015/0175407 A1 | 6/2015 | Cheng |
| 2015/0196912 A1 | 7/2015 | Tsai |

* cited by examiner

SEMICONDUCTOR MEMS STRUCTURE

PRIORITY DATA

The present application is a continuation application of U.S. patent application Ser. No. 16/948,641, filed Sep. 25, 2020, now U.S. Pat. No. 11,767,216, which is a continuation application of U.S. patent application Ser. No. 16/397,418 filed Apr. 29, 2019, now U.S. Pat. No. 10,787,360, which is a continuation application of U.S. patent application Ser. No. 15/819,346, filed Nov. 21, 2017, now U.S. Pat. No. 10,273,142, which is a divisional application of U.S. patent application Ser. No. 15/142,806, filed Apr. 29, 2016, now U.S. Pat. No. 9,828,234, the disclosure of each of which is hereby incorporated by reference in its entirety.

BACKGROUND

Electronic equipment involving semiconductive devices are essential for many modern applications. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Micro-electro mechanical system (MEMS) devices have been recently developed and are also commonly involved in electronic equipment. The MEMS device is a micro-sized device, usually in a range from less than 1 micron to several millimeters in size. The MEMS device includes fabrication using semiconductive materials to form mechanical and electrical features. The MEMS device may include a number of elements (e.g., stationary or movable elements) for achieving electro-mechanical functionality. MEMS devices are widely used in various applications. MEMS applications include motion sensors, pressure sensors, printer nozzles, or the like. Other MEMS applications include inertial sensors, such as accelerometers for measuring linear acceleration and gyroscopes for measuring angular velocity. Moreover, MEMS applications are extended to optical applications, such as movable mirrors, and radio frequency (RF) applications, such as RF switches or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
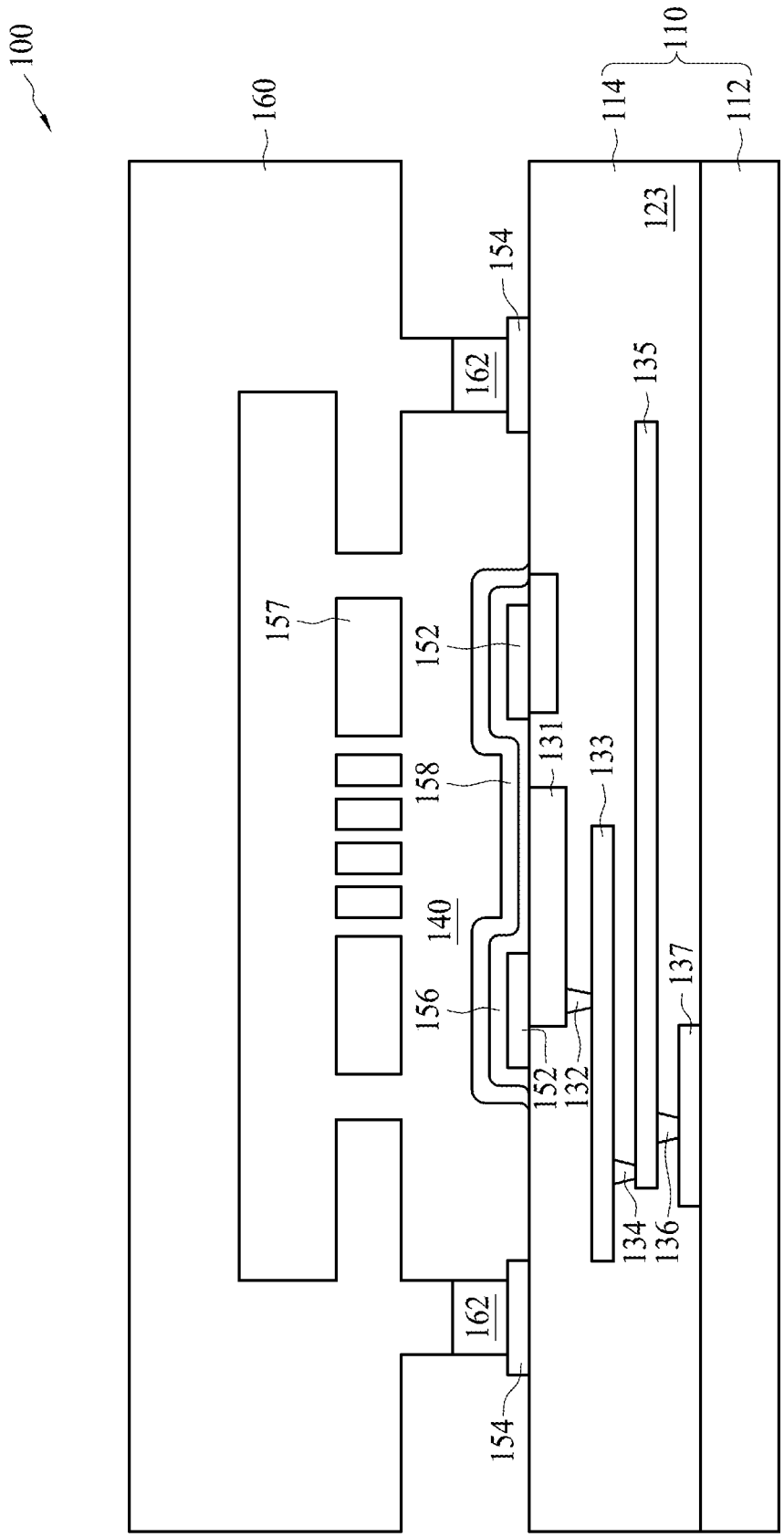
FIG. 1A is a schematic view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As MEMS devices are widely adopted in various applications, it is usually required that the structure of one MEMS device may accommodate more than one type of MEMS function. For example, a single MEMS framework may include an accelerometer and a gyroscope. For such MEMS devices, the final product is fabricated as a composite chip and performs multiple functions with a reduced die size.

In some cases, the merge of different types of MEMS elements into one die may confront incompatible design criterions. For example, the accelerometer is manufactured to form a cavity where a moderate amount of gas is permitted. However, a gyroscope is required to be fabricated under a near vacuum environment for achieving a designated sensing accuracy. Unfortunately, existing semiconductor methods cannot provide an efficient solution to make a cost-effective composite MEMS die.

Taking a combo chip as an example, the combo chip may be fabricated to combine an accelerometer and a gyroscope in a single MEMS structure with different manufacturing criteria. In addition, an anti-stiction layer is usually deposited on sensing electrodes of the MEMS structure for mitigating the stiction problem of a movable membrane when the movable membrane hits the sensing electrodes. An anti-stiction layer is usually deposited non-selectively and may be on each surface and sidewall of the MEMS structure. However, the anti-stiction layer may hinder the adhesion performance when a bonding operation is performed to bond different components at the bonding pads thereof. In order to maintain the performance of eutectic bonding, various methods are used for removing undesired anti-stiction materials at the bonding interface of the bonding pads before the MEMS device is sealed. Although those methods, such as a thermal treatment, may be effective in cleaning the anti-stiction materials off of the bonding interface, the integrity of the anti-stiction layer on the sensing electrodes would also be adversely affected.

The present disclosure presents a new architecture and method for mitigating the problems discussed above. A seed layer is patterned over the sensing electrodes before the anti-stiction layer is formed. Then the anti-stiction layer is deposited on the seed layer. The seed layer can effectively increase the bonding performance between the anti-stiction layer and the sensing electrodes. In addition, the seed layer is patterned to cover the sensing electrodes only. When a thermal removal process is performed to remove undesired portions of the anti-stiction layer on the surface on the bonding pads, the anti-stiction layer can still be safely bonded to the sensing electrodes through the seed layer.

FIG. 1A is a schematic perspective view of a semiconductor structure 100 in accordance with some embodiments of the present disclosure. In some embodiments, the semiconductor structure 100 comprises an MEMS device. The MEMS device 100 includes a first structure 110 having a substrate 112 and an interconnect structure 114. The MEMS device 100 also includes a second substrate 160 opposite to the first structure 110. The semiconductor structure 100 further includes several first pads 152 and several second pads 154, and a sensing element 157 in the cavity 140.

The first semiconductor structure 110 is configured to perform specific functions and communicate with neighboring components. In some embodiments, the first structure 110 may include a logic circuit. In some embodiments, the first structure 110 may further include memory cells or other electrical components. In some embodiments, the substrate 112 may include a myriad of passive or active components (not shown) disposed on a surface facing the interconnect structure 114. In some embodiments, the first structure 110 is referred to as a first substrate 110.

The substrate 112 includes a semiconductor material such as silicon. In some embodiments, the substrate 112 may include other semiconductor materials, such as silicon germanium, silicon carbide, gallium arsenide, or the like. In some embodiments, the substrate 112 is a p-type semiconductive substrate (acceptor type) or n-type semiconductive substrate (donor type). Alternatively, the substrate 112 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 112 is a semiconductor-on-insulator (SOI). In other alternatives, the substrate 112 may include a doped epitaxial layer, a gradient semiconductor layer, and/or a semiconductor layer overlaying another semiconductor layer of a different type, such as a silicon layer on a silicon germanium layer.

The interconnect 114 is disposed over the substrate 112. In some embodiments, the interconnect 114 is disposed between the second structure 160 and the substrate 112. The interconnect 114 is configured to electrically couple electrical components within the substrate 112. In some embodiments, the interconnect 114 is configured to electrically couple the substrate 112 with a device or component external to the first substrate 110. The interconnect 114 may include multiple metal layers. Each of the metal layers may include conductive wires or lines and is electrically coupled to an adjacent overlaying or underlying metal layer through at least one metal via. In the present embodiment, metal layers 131, 133, 135 and 137 are disposed in a layered structure and are interconnected through corresponding metal vias 132, 134 and 136. The numbers and patterns of the metal layers and vias of the interconnect 114 are provided for illustration. Other numbers of metal layers, metal vias, or conductive wires and alternative wiring patterns are also within the contemplated scope of the present disclosure.

Moreover, the aforesaid metal layers and metal vias are electrically insulated from other components. The insulation may be achieved by insulating materials. In some embodiments, the remaining portion of the interconnect 114 may be filled with an inter-metal dielectric (IMD) 123. The dielectric material of the IMD 123 may be formed of oxides, such as un-doped Silicate Glass (USG), Fluorinated Silicate Glass (FSG), low-k dielectric materials, or the like. The low-k dielectric materials may have k values lower than 3.8, although the dielectric materials of the IMD 123 may also be close to 3.8. In some embodiments, the k values of the low-k dielectric materials are lower than about 3.0, and may be lower than about 2.5.

In some embodiments, the first substrate 110 may be a sensing device configured to captured physical data. Typical sensing devices include an accelerometer, gyroscope, inertial measurement unit (IMU), acoustic sensor, temperature sensor, etc.

In some embodiments, the cavity 140 is formed between the first substrate 110 and the second substrate 160. In still other embodiments, the cavity 140 comprises a side on the first substrate 110 or the second substrate 160. The cavity 140 is formed to accommodate the sensing element 157 and the first pads 152. The first pads 152 may be disposed on one side of the cavity and extruding from a surface 114A of first substrate 110. In some embodiments, the first substrate 110 or the second substrate 160 comprises a recessed portion, and the cavity 140 may be formed by bonding the first substrate 110 with the second substrate 160 whereby the recessed portion is transformed into the cavity 140. In some embodiments, the cavity 140 may be filled with a gas or liquid for facilitating data sensing. In some embodiments, an inlet via is configured to introduce gas into the cavity 140. In some embodiments, the cavity 140 is kept at a vacuum or near-vacuum environment.

In some embodiments, the first pads 152 are configured as sensing electrodes. For example, the first pads 152 are configured to induce a variable capacitance or resistance in response to changes of data that is being measured. In some embodiments, the first pads (e.g., sensing electrodes) 152 are configured to perform data sensing in conjunction with the sensing element 157. In some embodiments, the sensed electrical properties, such as current or voltage, are transmitted to a data collection unit or signal processing unit in the first substrate 110 through the interconnect 114. For example, one first pad 152 is configured to provide the sensing data to the substrate 112 via the metal layers 131, 133, 135 and 137 and metal vias 132, 134 and 136.

The first pads 152 are disposed in the cavity 140. In some embodiments, the first pads 152 are disposed on one side of the cavity 140. In some embodiments, the first pads 152 may be disposed over the first substrate 110. In some embodiments, the first pads 152 are proximal to the sensing element 157. The first pads 152 and the sensing element 157 may be arranged closely but yet separate from each other.

The first pads 152 may be formed of conductors. Alternatively, the first pads 152 may be formed with conductive or semiconductive materials. In some embodiments, the first pads 152 may include metal such as gold, silver, aluminum, titanium, copper, tungsten, nickel, titanium, chromium, and an alloy, oxide or nitride thereof.

The second pads 154 are disposed on the cavity 140. In some embodiments, the second pads 154 are disposed on the top surface 114A of the first substrate 110. In some embodiments, the second pads 154 are disposed on a top surface of the interconnect 114 and leveled with the first pads 152. The second pads 154 are configured to provide bonds between the first substrate 110 and the second substrate 160.

In some embodiments, the second pads 154 are configured as bonding pads. For example, the second pads 154 are configured to form a eutectic bonding with the second substrate 160. In some embodiments, the second pads 154 may be formed with conductive materials. In some embodiments, the second pads 154 may include metal such as gold, silver, aluminum, titanium, copper, tungsten, nickel, titanium, chromium, and an alloy, oxide or nitride thereof.

The second substrate 160 is configured to form the cavity 140 in conjunction with the first substrate 110. In some embodiments, the second structure 160 is configured to serve as a capping substrate over the first substrate 110.

The second substrate 160 includes a semiconductor material such as silicon. In some embodiments, the second substrate 160 may include other semiconductor materials, such as silicon germanium, silicon carbide, gallium arsenide, or the like. In some embodiments, the second substrate 160 is a p-type semiconductive substrate (acceptor type) or n-type semiconductive substrate (donor type). Alternatively, the second substrate 160 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the second substrate 160 is a semiconductor-on-insulator (SOI). In some embodiments, the material of the second substrate 160 is the same as that of the substrate 112.

The second substrate 160 comprises several protrusions extended toward the first substrate 110. Also, the second substrate 160 comprises a bonding portion 162 at one end for each of the protrusions. The bonding portions 162 are configured to bond with the second pads 154. In some embodiments, the bonding portions 162 perform eutectic bonding with the second pads 154. In some embodiments, the bonding portions 162 comprise a suitable metal for composing eutectic alloys, such as In, Sn, Si and Ge. In some embodiments, the materials of the second pads 154 and the bonding portions 162 can be exchanged such that both the second pads 154 and the bonding portions 162 still constitute all elements for the same eutectic alloys.

The sensing element 157 is disposed opposite to the first substrate 110. In some embodiments, the sensing element 157 is disposed away from the first pads 152 at a distance of about 0.5 µm to about 5 µm, or about 0.3 µm to about 5 µm. In some embodiments, the sensing element 157 is a movable membrane. In some embodiments, the sensing element 157 is in circular, rectangular, quadrilateral, triangular, hexagonal, or any other suitable shapes. In some embodiments, the sensing element 157 includes polysilicon. In some embodiments, the sensing element 157 is conductive and capacitive. In some embodiments, the sensing element 157 is supplied with a predetermined charge prior to performing data sensing.

In some embodiments, the sensing element 157 is a movable or oscillatable element. For example, the sensing element 157 is displaceable relative to the first substrate 110 and the first pads 152. In some embodiments, the sensing element 157 is a movable membrane or diaphragm. In some embodiments, the displacement of the sensing element 157 relative to the first pads 152 would cause a capacitance change between the sensing element 157 and the first pads 152. In some embodiments, the sensing element 157 is configured to capture a resistance change resulting from movement of the gas in the cavity 140. The change of capacitance or resistance would then be translated into an electrical signal by a circuitry connected with the sensing element 157 or the first pads 152. In some embodiments, the electrical signal generated would be transmitted to another device, another substrate or another circuitry for further processing.

In some embodiments, the movable membrane 157 may be displaced to contact the first pads 152 in response to an external stimulus, and restored to its original straight configuration. In some embodiments, the movable membrane 157 may be attached to the first pads 152 after hitting the first pads 152, and is not capable of moving for a certain period. The issue of membrane stiction may cause the semiconductor device 100 to provide sensing results with reduced accuracy and reliability. In order to alleviate the stiction problem of the movable membrane 157, in some embodiments, an anti-stiction layer 158 is proposed.

The anti-stiction layer 158 is disposed between the sensing element 157 and the first pads 152. In some embodiments, the anti-stiction layer 158 is attached on a surface of the sensing element 157, or a top surface and sidewalls of the first pads 152 at the contacting portions. For example, the sensing element 157 oscillates and contacts a top surface of the first pad 152. The anti-stiction layer 158 covers the top surface of the first pad 152. In some embodiments, the sensing element 157 oscillates and contacts a sidewall of the first pad 152. In that case, the anti-stiction layer 158 covers the sidewall of the first pad 152.

In some embodiments, the anti-stiction layer is a self-assembled monolayer (SAM) coating. In some embodiments, the SAM coating 158 has a thickness from about 5 Å to about 30 Å. In some embodiments, the SAM coating 158 has a thickness from about 15 Å to about 30 Å. In some embodiments, the SAM coating 158 has a thickness from about 5 Å to about 15 Å.

In some embodiments, the anti-stiction layer 158 comprises a hydrophobic surface which is helpful in counteracting the stiction strength of the sensing element 157. In some embodiments, the presence of the anti-stiction layer 158 may be measured by the hydrophobic characteristic thereof. For example, the anti-stiction layer 158 may be measured with a water contact angle (WCA) metric. In some embodiments, the anti-stiction layer 158 comprises a WCA greater than about 90 degrees. In some embodiments, the anti-stiction layer 158 comprises a WCA from about 90 degrees to about 150 degrees. In some embodiments, the anti-stiction layer 158 comprises a WCA from about 100 degrees to about 120 degrees.

As discussed previously, when the anti-stiction material, such as the SAM coating 158, is coated upon surfaces and sidewalls of the semiconductor structure 100, portions of the SAM coating 158 may cover top surfaces of the second pads 154. When the first substrate 110 is bonded with the bonding portions 162 of the second substrate 160, the interposed anti-stiction material may hinder the bonding performance. A conventional method, such as a thermal treatment, may be effective in cleaning the anti-stiction material off of the bonding interface. However, the removal of the anti-stiction layer is not selective to different underlying materials. As a result, the anti-stiction layer on the sensing pads would also be partially or completely removed. The anti-stiction property of the sensing pads is deteriorated accordingly.

In the present disclosure, a film 156 is patterned and disposed on the first pads 152. The film 156 may serve as a seed layer for the anti-stiction layer 158. In some embodiments, the film 156 layer is disposed between the first pads 152 and the anti-stiction layer 158. In some embodiments, the film 156 layer is sandwiched between the first pads 152 and the anti-stiction layer 158. The film 156 couples the first pads 152 with the anti-stiction layer 158. Therefore, the film 156 is arranged to enhance the inter-layer bondability between the anti-stiction layer 158 and the first pads 152. In addition, the film 156 comprises a predetermined pattern to cover the first pads 152 only. In other words, the film 156 is configured to expose the second pads 154 in order to help bonding between the second pads 154 and the bonding portions 162. However, a portion of the anti-stiction layer 158 on the first pads 152 are preserved by the film 156. As a result, when an annealing process is performed to remove other portions of the anti-stiction layer 158 on the surface of the second pads 154, the anti-stiction layer 158 can still be securely bonded to the first pads 152 through the film 156.

In some embodiments, the film 156 contains silicon, or an oxide thereof. Alternatively, the film 156 contains a silicon nitride. In some embodiments, the film 156 comprises dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The film 156 and the anti-stiction layer 158 may be referred to as a silicon-containing layer 156/158.

Figure 1B:
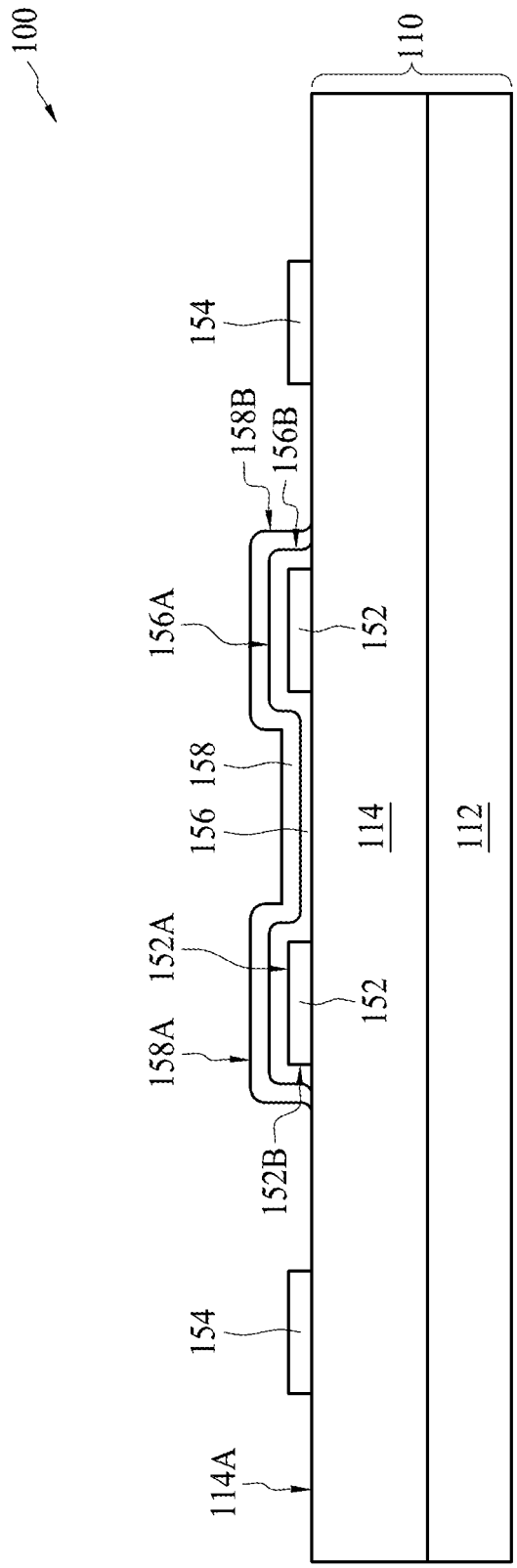
FIG. 1B is a partially enlarged schematic view of the semiconductor device in FIG. 1A, in accordance with some embodiments of the present disclosure.

FIG. 1B is a partially enlarged schematic view of the semiconductor device 100 in FIG. 1A, in accordance with some embodiments of the present disclosure. Specifically, several mesas including the first pads 152 are formed and protrude from the top surface 114A of the first substrate 110.

The film 156 exposes at least a portion of the top surface 114A of the first substrate 110. For example, a portion of the top surface 114A of the interconnect 114 that is away from the mesas 152 is exposed from the film 156. In some embodiments, the film 156 covers a top surface 152A and a sidewall 152B of the mesa 152. In some embodiments, the anti-stiction layer 158 covers a top surface 156A and a sidewall 156B of the film 156. In some cases the sensing element 157 oscillates in a lateral direction substantially parallel to the top surface 114A and would otherwise contact the sidewall 152B of the mesa 152 if the anti-stiction layer 156 is absent. As a result, a lateral stiction phenomenon may otherwise occur. In the present disclosure, the composite layer of anti-stiction layer 158 and the seed layer 156 covers the sidewall 152B. The composite layer 156/158 is configured to expose the second pads 154. Therefore, the bonding performance of the second pads 154 would not be adversely affected.

In some embodiments, the composite layer 156/158 comprises a top surface 158A having a higher WCA than the top surface 114A and any surface of the second pads 154. In some embodiments, the composite layer 156/158 comprises a top surface having a WCA greater than 90 degrees. In some embodiments, the composite layer 156/158 comprises a top surface having a WCA between 90 degrees and 150 degrees. In some embodiments, the composite layer 156/158 comprises a top surface having a WCA between 100 degrees and 120 degrees.

In some embodiments, the composite layer 156/158 comprises a sidewall 158B having a higher WCA than the top surface 114A and any surface of the second pads 154. In some embodiments, the composite layer 156/158 comprises a sidewall having a WCA greater than 90 degrees. In some embodiments, the composite layer 156/158 comprises a sidewall having a WCA between 90 degrees and 150 degrees. In some embodiments, the composite layer 156/158 comprises a sidewall having a WCA between 100 degrees and 120 degrees.

In some embodiments, the seed layer 156 may be differentiated from the anti-stiction layer 158 in terms of thickness. In some embodiments, the seed layer 156 has a larger thickness than the anti-stiction layer 158. For example, the seed layer 156 comprises a thickness from about 80 Å to about 300 Å. In other embodiments, the seed layer 156 comprises a thickness from about 100 Å to about 200 Å. In some embodiments, a ratio of thickness between the seed layer 156 and the anti-stiction layer 158 is greater than about 10. In some embodiments, a ratio of thickness between the seed layer 156 and the anti-stiction layer 158 is from about 10 to about 50. In some embodiments, a ratio of thickness between the seed layer 156 and the anti-stiction layer 158 is from about 50 to about 100.

Figure 2A:
FIGS. 2A through 2G are cross-sectional views of intermediate structures for a method of manufacturing the semiconductor structure in FIG. 1A, in accordance with some embodiments.

FIGS. 2A through 2G are cross-sectional views of intermediate structures for a method of manufacturing a semiconductor structure in FIG. 1A, in accordance with some embodiments. In FIG. 2A, the substrate 112 is provided. In some embodiments, at least one active or passive element (not shown) may be formed in the substrate 112. The substrate 112 has a first dopant type, such as a P-type.

Figure 2B:
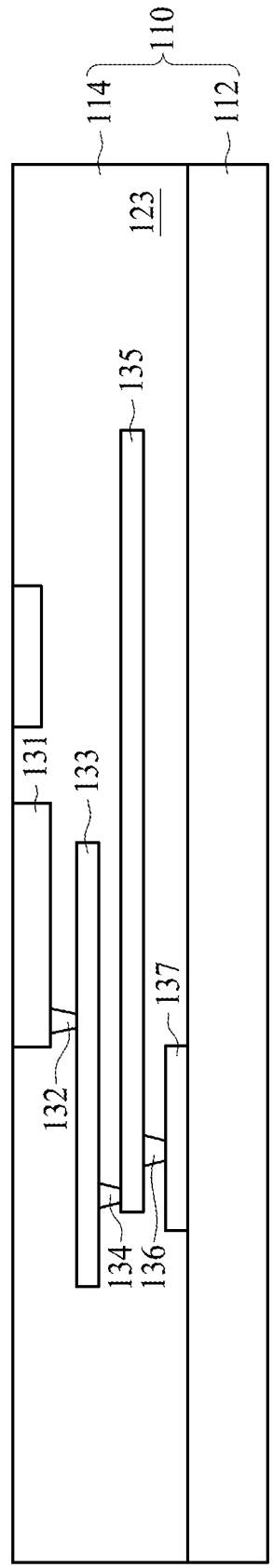

Referring to FIG. 2B, the interconnect 114 is formed over the substrate 112. The interconnect 114 may be formed of stacked metal layers from a bottom layer to a top layer. For example, the metal layer 137 is formed by depositing a mask layer (not separately shown) on the substrate 112. The mask layer is patterned through an etching operation to form desired patterns. Then, conductive materials are filled in the etched patterns. The mask layer is stripped off by a removing operation after the pattern is filled with conductive materials. The IMD material 123 may be filled among the conductive materials of the metal layer 137. Similarly, the conductive via layer 136 is formed over the metal layer 137 in order to generate a conductive connection between the metal layer 137 and the overlaying metal layer 135. The metal layers 135, 133 and 131 are formed in sequence along with the intervening conductive via layers 134 and 132. A portion of the metal layer 131 is exposed from the interconnect 114.

Figure 2C:
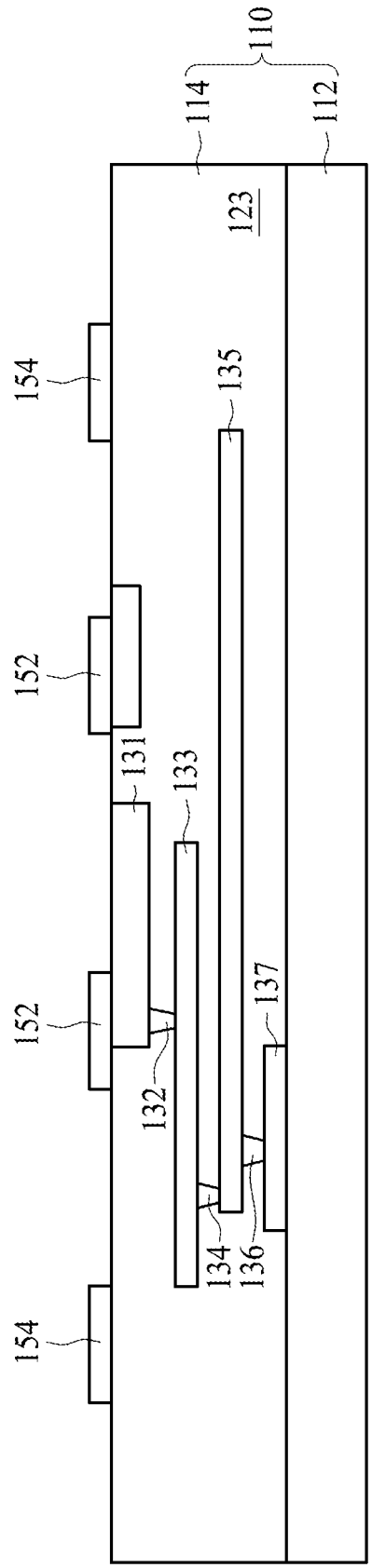

Referring to FIG. 2C, several first pads 152 and second pads 154 are formed at a topmost level of the first interconnect structure 114. The first pads 152 are configured as sensing electrodes or metallic bumps on bump stop structures while the second pads 154 are used for bonding with overlaying structures.

Figure 2D:
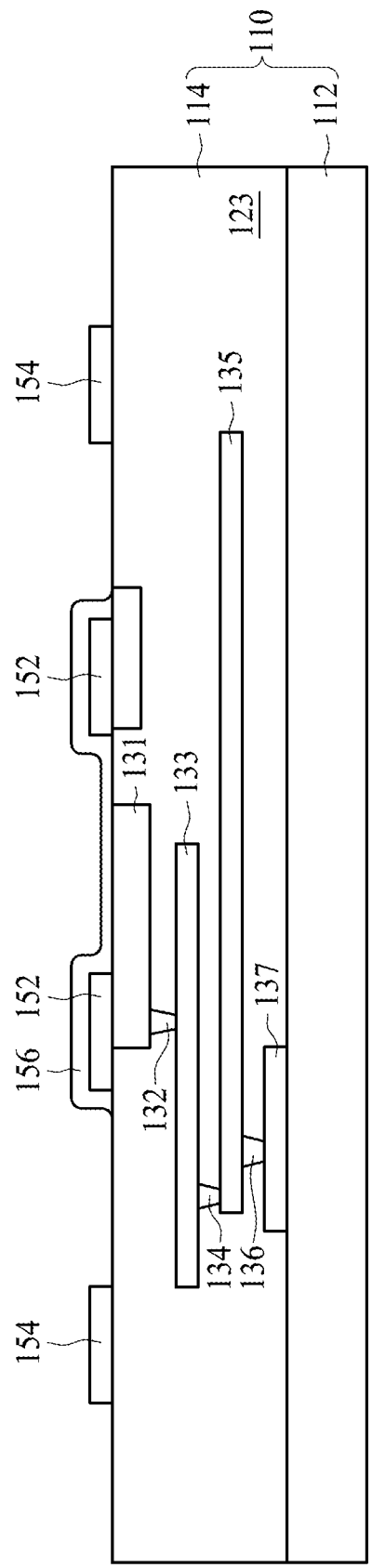

In FIG. 2D, a patterned film 156 is deposited on the first pads 152. The patterned film 156 may be formed by providing a mask layer with a predetermined pattern over the interconnect 114, followed with an operation of vapor deposition or spin coating. "Vapor deposition" refers to processes of depositing materials on a substrate though the vapor phase. Vapor deposition processes include any process such as, but not limited to, chemical vapor deposition (CVD) and physical vapor deposition (PVD). Examples of vapor deposition methods include hot filament CVD, radio-frequency CVD (rf-CVD), laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), plasma-enhanced CVD (PECVD), high-density plasma CVD (HDPCVD), low-pressure CVD (LPCVD) and the like. In some embodiments, the film 156 includes silicon oxide or silicon nitride. A precursor for the deposition process may include silane. The mask layer is stripped off after the deposition operation is completed. The patterned film 156 covers the top surface 152A and sidewalls 152B of the first pads 152.

Figure 2E:
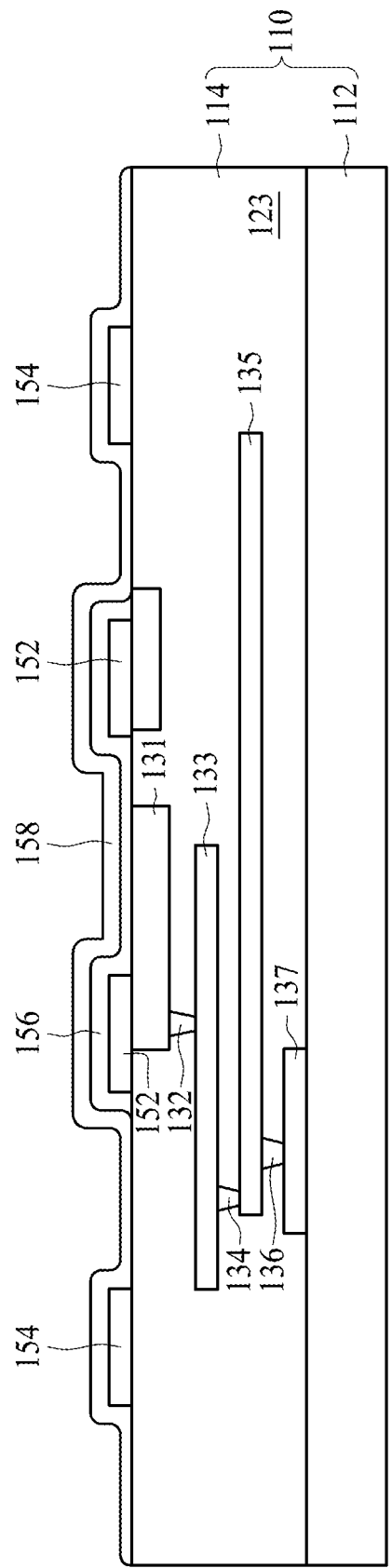

Referring to FIG. 2E, an anti-stiction material 158 is blanket deposited over the top surface 114A of the interconnect 114. In addition, the anti-stiction material 158 covers the top surface 156A and sidewalls 156B of the film 156. In some embodiments, the anti-stiction material 158 may cover the top surface or sidewalls of the second pads 154. The anti-stiction layer 158 may be formed by vapor deposition. Examples of vapor deposition methods include molecular vapor deposition (MVD), hot filament CVD, radio-frequency CVD (rf-CVD), laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), plasma-enhanced CVD (PECVD), high-density plasma CVD (HDPCVD), low-pressure CVD (LPCVD) and the like.

Figure 2F:
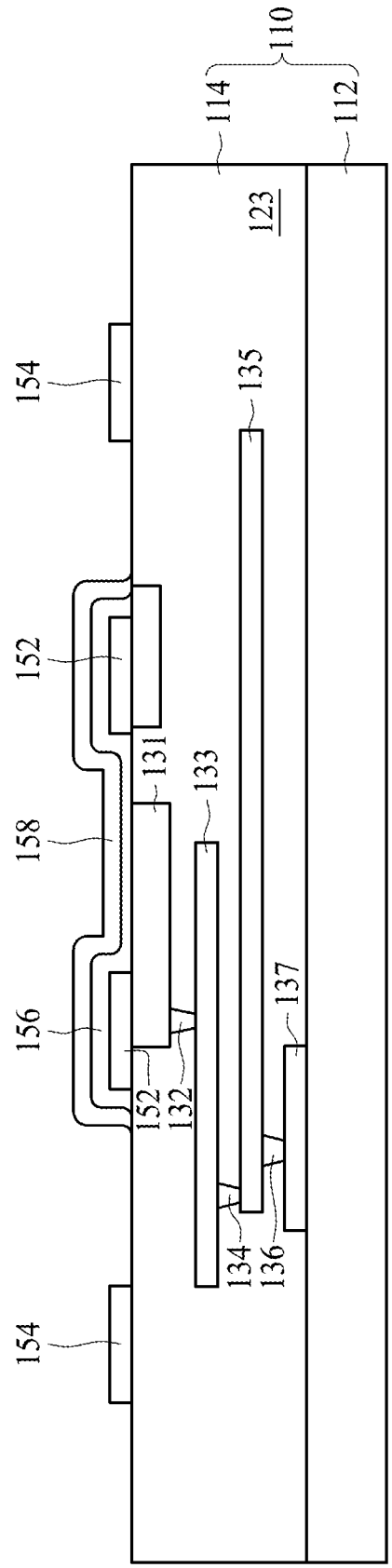

In an operation with reference to FIG. 2F, a thermal treatment or annealing process is applied to the first substrate 110. The control parameters for the thermal treatment include a process temperature and a process period. In some embodiments, the process temperature may be controlled at about 400 degrees Celsius, and the process period may be control as about 120 minutes. After the thermal treatment, only the portions of the anti-stiction layer 158 bonded with the seed layer 156 are kept intact. In other words, the remaining seed layer 156 covers the top surface 156A and sidewalls 156B of the seed layer 156. The other portions of the anti-stiction material 158, such as those disposed on the second pads 154, are removed due to the annealing operation.

Figure 2G:
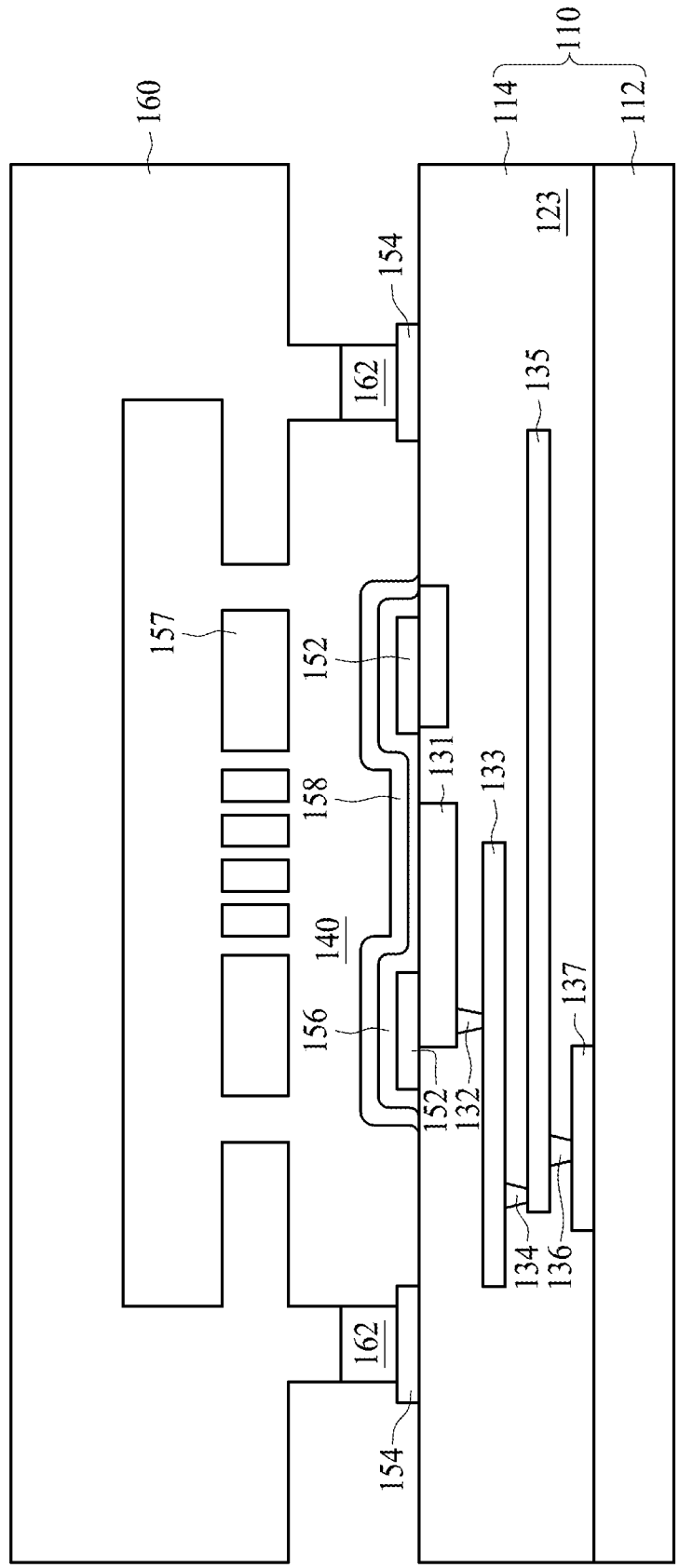

Referring to FIG. 2G, the second substrate 160 including the sensing element 157 is provided and bonded with the interconnect 114 of the first substrate 110. The cavity 140 is formed accordingly. The bonding process may comprise suitable operations, such as compressive bonding, thermal diffusion bonding, and eutectic bonding. In some embodiments, the bonding portions 162 are configured to form eutectic bonds with the interconnect 114. The bonding interface between the bonding portions 162 and the interconnect 114 is free of the anti-stiction material 158. As a result, the bonds along with the securely deposited anti-stiction layer over the first pads 152 can help provide reliable MEMS products with a wafer level package process.

The present disclosure provides a method of manufacturing a structure. The method comprises: providing a first substrate; forming a plurality of conductive pads over the first substrate; forming a film on a first subset of the plurality of conductive pads thereby leaving a second subset of the plurality of conductive pads exposed from the film; forming a self-assembled monolayer (SAM) over the film; and forming a cavity by the first substrate and a second substrate through bonding a portion of the second substrate to the second subset of the plurality of conductive pads that are exposed from the film.

The present disclosure provides a method of manufacturing a structure. The method comprises: providing a first substrate; forming a conductive mesa over the first substrate; forming a silicon containing layer over the mesa; and forming a cavity comprising a movable member proximal to the first substrate.

The present disclosure provides a structure. The structure comprises a cavity enclosed by a first substrate and a second substrate opposite to the first substrate. The structure also includes a movable membrane in the cavity. Further, the structure includes a mesa in the cavity and the mesa is protruded from a surface of the first substrate. In addition, the structure includes a dielectric layer over the mesa, wherein the dielectric layer includes a first surface in contact with the mesa and a second surface opposite to the first surface is positioned toward the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
    a contiguous cavity enclosed by a first substrate and a second substrate opposite to the first substrate;
    a feature within the contiguous cavity, the feature protruding into the contiguous cavity to a top surface of the feature;
    a dielectric layer over the top surface of the feature and in the contiguous cavity; and
    a layer over the dielectric layer and within the contiguous cavity, wherein the layer provides a hydrophobic surface exposed within the contiguous cavity.

2. The structure according to claim 1, wherein the dielectric layer interfaces a sidewall of the feature, and the layer is disposed directly on the dielectric layer.

3. The structure according to claim 1, wherein the feature is a conductive element.

4. The structure according to claim 1, further comprising a conductive pad on the first substrate, wherein the conductive pad is coplanar with the feature and wherein the conductive pad is in contact with a bonding portion on the second substrate defining edges of the contiguous cavity.

5. The structure according to claim 1, wherein the layer has a terminal edge, the terminal edge being disposed between an edge of the contiguous cavity and the feature.

6. The structure according to claim 5, wherein the terminal edge interfaces an upper surface of the first substrate.

7. The structure according to claim 1, further comprising:
    another feature within the contiguous cavity, the feature protruding into the contiguous cavity and spaced a distance from the feature, wherein the dielectric layer and the layer each extend contiguously over the feature and the another feature.

8. A semiconductor structure, comprising:
    a first substrate having a first region, a second region, and a third region of a top surface, wherein the second region is disposed between the first region and third region;
    a plurality of features over the first region and the third region of the top surface of the first substrate;
    a film wherein the film is patterned such that the film is disposed over a first subset of the plurality of features and not a second subset of the plurality of features, wherein the first subset of the plurality of features is disposed in the first region and the second subset of the plurality of features is disposed in the third region;
    a layer over the film in the first region; and a cavity defined by the first substrate and a second substrate wherein the first region including the first subset of the plurality of features is within the cavity, the second region is within the cavity, and the third region including the second subset of the plurality of features is bonded to a second substrate and defines an edge of the cavity.

9. The semiconductor structure of claim 8, wherein at least a portion of the second region is free of the film.

10. The semiconductor structure of claim 9, wherein a terminal edge of the film is in the second region.

11. The semiconductor structure of claim 8, wherein a terminal edge of the layer is in the second region.

12. The semiconductor structure of claim 8, wherein the second subset of features is in direct contact with a bonding portion on the second substrate.

13. The semiconductor structure of claim 8, wherein the first substrate further includes an interconnect having a top metal layer, at least one of the first subset of the plurality of features is disposed on the top metal layer.

14. The semiconductor structure of claim 8, wherein at least one of the second subset of the plurality of features is bonded to the second substrate by a eutectic bond.

15. A semiconductor structure, comprising:
a first conductive feature and a second conductive feature each extending over an upper surface of a first substrate, wherein the first conductive feature is spaced a lateral distance from the second conductive feature;
a silicon containing layer over the first conductive feature, wherein the silicon containing layer has a terminus edge in the lateral distance between the first conductive feature and the second conductive feature; and
a second substrate bonded to the first substrate, wherein a top surface of the second conductive feature is bonded to an element of the second substrate.

16. The semiconductor structure of claim 15, further comprising:
a third conductive feature extending over the upper surface of the first substrate, wherein the third conductive feature is spaced another lateral distance from the first conductive feature, wherein the first conductive feature interposes the third conductive feature and the second conductive feature.

17. The semiconductor structure of claim 16, wherein the silicon containing layer covers the third conductive feature.

18. The semiconductor structure of claim 17, further comprising: a self-assembled monolayer (SAM) directly over the silicon containing layer.

19. The semiconductor structure of claim 18, wherein the SAM covers the terminus edge of the silicon containing layer and covers another terminus edge of the silicon containing layer adjacent the third conductive feature.

20. The semiconductor structure of claim 19, wherein the silicon containing layer is a dielectric material.

* * * * *